(12) United States Patent
Ito

(10) Patent No.: US 7,135,354 B2
(45) Date of Patent: Nov. 14, 2006

(54) SEMICONDUCTOR DEVICE AND METHOD OF MANUFACTURING THE SAME, SEMICONDUCTOR WAFER, CIRCUIT BOARD AND ELECTRONIC INSTRUMENT

(75) Inventor: Haruki Ito, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/763,858

(22) Filed: Jan. 21, 2004

(65) Prior Publication Data

US 2004/0192024 A1 Sep. 30, 2004

(30) Foreign Application Priority Data

Feb. 14, 2003 (JP) ............................. 2003-036143

(51) Int. Cl.
H01L 21/44 (2006.01)
H01L 21/4763 (2006.01)

(52) U.S. Cl. .................. 438/113; 438/110; 438/114; 438/612; 438/618

(58) Field of Classification Search .................... None
See application file for complete search history.

(56) References Cited

U.S. PATENT DOCUMENTS

| 5,517,758 | A | 5/1996 | Nakamura | |
|---|---|---|---|---|
| 5,827,604 | A | 10/1998 | Uno | |
| 6,236,114 | B1 | 5/2001 | Huang et al. | |
| 6,313,540 | B1* | 11/2001 | Kida et al. | 257/784 |
| 6,316,288 | B1 | 11/2001 | Hashimoto | |
| 6,713,859 | B1* | 3/2004 | Ma | 257/687 |
| 2002/0005568 | A1* | 1/2002 | Kikuchi | 257/620 |
| 2002/0008320 | A1* | 1/2002 | Kuwabara et al. | 257/738 |
| 2002/0089058 | A1 | 7/2002 | Hedler et al. | |
| 2002/0125569 | A1 | 9/2002 | Fukuda et al. | |

FOREIGN PATENT DOCUMENTS

| JP | 5-267474 | 10/1993 |
|---|---|---|
| JP | 2000-340696 | 12/2000 |
| JP | 2001-015560 | 1/2001 |
| JP | 2001-144217 | 5/2001 |
| KR | 97-700988 | 2/1997 |
| KR | 10-0200687 | 6/1999 |
| KR | 2001-70064 | 7/2001 |
| WO | WO01/071805 | 9/2001 |

OTHER PUBLICATIONS

Stanley Wolf and Richard Tauber, "Silicon Processing for the VLSI Era" vol. 1, Lattice Press 1986, pp. 407-409.*
Communication from European Patent Office re: related application.
Communication from Korean Patent Office regarding counterpart application.
Communication from Korean Patent Office re: related application.

* cited by examiner

Primary Examiner—Michael Lebentritt
Assistant Examiner—Cheung Lee
(74) Attorney, Agent, or Firm—Harness, Dickey & Pierce, P.L.C.

(57) ABSTRACT

A resin layer is formed on a semiconductor substrate in which a plurality of integrated circuits are formed. In the surface of the resin layer, a plurality of recesses are formed. On the resin layer, an interconnecting line is formed to pass along any of the recesses. The semiconductor substrate is cut into a plurality of semiconductor chips. Each recess is formed to have an opening width less than the thickness of the interconnecting line, and a depth of at least 1 μm.

11 Claims, 6 Drawing Sheets ated on Feb. 14, 2003, is hereby incorporated by reference in its entirety.

BACKGROUND OF THE INVENTION

The present invention relates to a semiconductor device and method of manufacture thereof, and to a semiconductor wafer, circuit board, and electronic instrument.

In recent years, attention has been drawn to manufacture on the wafer level, the so-called wafer level CSP (Chip Scale/Size Package). With wafer level CSP, a resin layer is formed on a semiconductor wafer, interconnecting lines are formed on the resin layer, and thereafter the semiconductor wafer is diced into a plurality of semiconductor devices. Here the adhesion properties between the resin layer and the interconnecting lines are important for raising the reliability.

BRIEF SUMMARY OF THE INVENTION

A method of manufacturing a semiconductor device according to one aspect of the present invention includes:

forming a resin layer on a semiconductor substrate in which a plurality of integrated circuits are formed;

forming a plurality of recesses in a surface of the resin layer;

forming an interconnecting line on the resin layer, to pass along any one of the recesses; and cutting the semiconductor substrate into a plurality of semiconductor chips;

wherein each of the recesses is formed to have an opening width less than a thickness of the interconnecting line, and to have a depth of at least 1 μm.

A semiconductor wafer according to another aspect of the present invention includes:

a semiconductor substrate in which a plurality of integrated circuits are formed;

a resin layer formed on the semiconductor substrate, and having a plurality of recesses formed in a surface of the resin layer; and an interconnecting line formed on the resin layer, to pass along any one of the recesses, wherein each of the recesses is formed to have an opening width less than a thickness of the interconnecting line, and to have a depth of at least 1 μm.

A semiconductor chip according to a further aspect of the present invention includes:

a semiconductor chip in which a plurality of integrated circuits are formed;

a resin layer formed on the semiconductor chip, and having a plurality of recesses formed in a surface of the resin layer; and an interconnecting line formed on the resin layer, to pass along any one of the recesses, wherein each of the recesses is formed to have an opening width less than a thickness of the interconnecting line, and to have a depth of at least 1 μm.

A circuit board according to a still further aspect of the present invention has the above semiconductor device mounted thereon.

An electronic instrument according to a yet further aspect of the present invention has the above semiconductor device.

DETAILED DESCRIPTION OF THE EMBODIMENT

Figure 1:
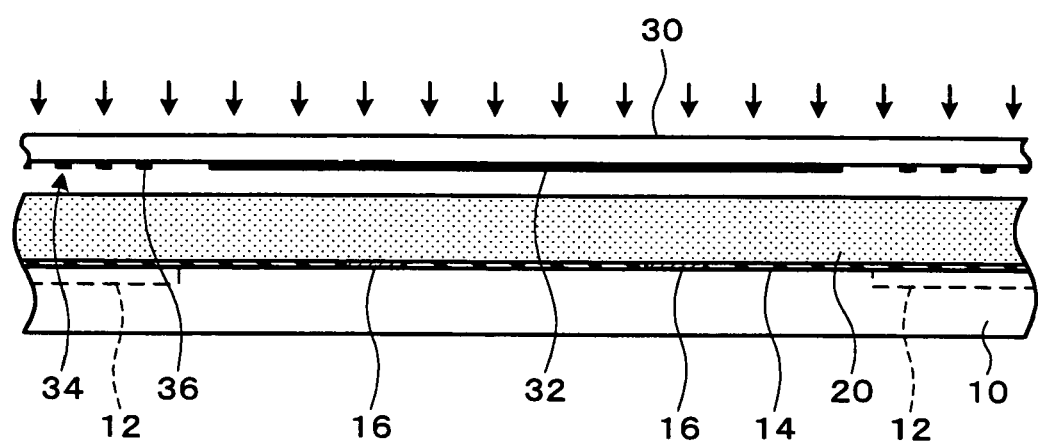
FIG. 1 illustrates a method of manufacturing a semiconductor device according to an embodiment of the present invention.

Embodiments of the present invention may improve the reliability of a semiconductor device and method of manufacture thereof, a semiconductor wafer, a circuit board, and an electronic instrument.

(1) A method of manufacturing a semiconductor device according to one embodiment of the present invention includes:

forming a resin layer on a semiconductor substrate in which a plurality of integrated circuits are formed;

forming a plurality of recesses in a surface of the resin layer;

forming an interconnecting line on the resin layer, to pass along any one of the recesses; and cutting the semiconductor substrate into a plurality of semiconductor chips;

wherein each of the recesses is formed to have an opening width less than a thickness of the interconnecting line, and to have a depth of at least 1 μm. According to this embodiment, since the interconnecting line is formed to pass along the recesses in the resin layer, the adhesion properties of the resin layer and interconnecting line is improved.

(2) With this method of manufacturing a semiconductor device, the resin layer may be formed of a photosensitive resin precursor, in the step of forming the recesses, photolithography using a mask may be applied, and the mask may include a transparent-and-opaque pattern for carrying out light irradiation with too fine pattern for the photosensitive resin precursor to be resolved.

(3) With this method of manufacturing a semiconductor device, the photosensitive resin precursor may be a negative type including an insoluble light-sensitive portion, and the transparent-and-opaque pattern may include an opaque portion having a width less than or equal to the thickness of the interconnecting line.

(4) With this method of manufacturing a semiconductor device, the width of the opaque portion may be less than or equal to one-fourths of a thickness of the resin layer.

(5) This method of manufacturing a semiconductor device may further include roughening the surface of the resin layer including inner surfaces of the recesses, after forming the recesses and before forming the interconnecting line.

(6) This method of manufacturing a semiconductor device may further include forming a second resin layer on the resin layer to cover at least a part of the interconnecting line, after forming the interconnecting line and before cutting the semiconductor substrate.

(7) This method of manufacturing a semiconductor device may further include forming recesses and projections on a surface of the second resin layer.

(8) This method of manufacturing a semiconductor device may further include forming a third resin layer on the second resin layer.

(9) The method of manufacturing a semiconductor device may further include forming recesses and projections on a surface of the third resin layer.

(10) A semiconductor wafer according to another embodiment of the present invention includes:

a semiconductor substrate in which a plurality of integrated circuits are formed;

a resin layer formed on the semiconductor substrate, and having a plurality of recesses formed in a surface of the resin layer; and an interconnecting line formed on the resin layer, to pass along any one of the recesses, wherein each of the recesses is formed to have an opening width less than a thickness of the interconnecting line, and to have a depth of at least 1 µm. According to this embodiment, since the interconnecting line is formed to pass along the recesses in the resin layer, the adhesion properties of the resin layer and interconnecting line is improved.

(11) With this semiconductor wafer, the opening width of each of the recesses may be less than or equal to one-fourths of a thickness of the resin layer.

(12) With this semiconductor wafer, the recesses may be formed over an entire area of the surface of the resin layer.

(13) With this semiconductor wafer, the interconnecting line may have a land for providing an external terminal; and the recesses may be formed at least in a region under the land of the resin layer.

(14) With this semiconductor wafer, the surface of the resin layer including inner surfaces of the recesses may be roughened.

(15) With this semiconductor wafer, the resin layer maybe defined as a first resin layer, and the semiconductor wafer may further include a second resin layer formed on the first resin layer so as to cover at least a part of the interconnecting line.

(16) With this semiconductor wafer, recesses and projections may be formed on a surface of the second resin layer.

(17) This semiconductor wafer may further include a third resin layer formed on the second resin layer.

(18) With this semiconductor wafer, recesses and projections may be formed on a surface of the third resin layer.

(19) With this semiconductor wafer, the third resin layer may be formed of a material having a higher opacity than the first and second resin layers.

(20) A semiconductor chip according to a further embodiment of the present invention includes:

a semiconductor chip in which a plurality of integrated circuits are formed;

a resin layer formed on the semiconductor chip, and having a plurality of recesses formed in a surface of the resin layer; and an interconnecting line formed on the resin layer, to pass along any one of the recesses, wherein each of the recesses is formed to have an opening width less than a thickness of the interconnecting line, and to have a depth of at least 1 µm. According to this embodiment, since the interconnecting line is formed to pass along the recesses in the resin layer, the adhesion properties of the resin layer and interconnecting line is improved.

(21) With this semiconductor device, the opening width of each of the recesses may be less than or equal to one-fourths of a thickness of the resin layer.

(22) With this semiconductor device, the recesses may be formed over an entire area of the surface of the resin layer.

(23) With this semiconductor device, the interconnecting line may have a land for providing an external terminal; and the recesses may be formed at least in a region under the land of the resin layer.

(24) With this semiconductor device, the surface of the resin layer including inner surfaces of the recesses may be roughened.

(25) With this semiconductor device, the resin layer may be defined as a first resin layer, and the semiconductor device further may include a second resin layer formed on the first resin layer so as to cover at least a part of the interconnecting line.

(26) With this semiconductor device, recesses and projections may be formed on a surface of the second resin layer.

(27) This semiconductor device may further include a third resin layer formed on the second resin layer.

(28) With this semiconductor device, recesses and projections may be formed on a surface of the third resin layer.

(29) With this semiconductor device, the third resin layer may be formed of a material having a higher opacity than the first and second resin layers.

(30) A circuit board according to a still further embodiment of the present invention has the above semiconductor device mounted thereon.

(31) An electronic instrument according to a yet further embodiment of the present invention has the above semiconductor device.

The present invention is now described in terms of a number of preferred embodiments, with reference to the drawings, but is not limited to this embodiment. The present invention can be applied to the form of semiconductor device known as CSP (Chip Size/Scale Package).

As shown in FIG. 1, in this embodiment a semiconductor substrate (for example, a semiconductor wafer) 10 is used. On the semiconductor substrate 10 is formed an integrated circuit 12. When the semiconductor substrate 10 is cut into a plurality of semiconductor chips 90 (see FIG. 7), a plurality of integrated circuits 12 is formed on the semiconductor substrate 10, and each semiconductor chip 90 has its own integrated circuit 12.

On the surface of the semiconductor substrate 10, a passivation film 14 of at least one layer may be formed. The passivation film 14 is an electrical insulating film. The passivation film 14 may be formed only of a material that is not a resin (for example, SiO2 or SiN), or may further include thereon a film formed of a resin (for example, polyimide resin). The passivation film 14 does not include conducting particles.

On the semiconductor substrate 10 are formed electrodes 16. The electrodes 16 may be parts (extremities) of interconnecting lines electrically connected to the integrated circuit 12. The passivation film 14 is formed to avoid at least a central portion of the electrodes 16. The passivation film 14 may overlap the extremities of the electrodes 16.

In this embodiment, a resin layer 20 is formed on the semiconductor substrate 10. The resin layer 20 may be formed by applying a resin precursor to the semiconductor substrate 10, or by spreading a resin precursor on the semiconductor substrate 10 by spin coating. In this embodiment, the resin layer 20 includes both states of before and after curing polymerization). The resin layer 20 may be a plurality of layers, or may be a single layer. The resin layer 20 is an electrical insulation layer. The resin layer 20 may have a stress relieving function after curing (polymerization). The resin layer 20 may be formed of a polyimide resin, a silicone denatured polyimide resin, an epoxy resin, a silicone denatured epoxy resin, benzocyclobutene (BCB), polybenzoxazole (PBO), or similar resins (or precursors thereof) resin layer 20 does not include conducting particles. The resin layer 20 may be formed of a material opaque to light.

The resin layer 20 may be formed of a radiation-sensitive resin precursor, which has the property of being sensitive to radiation (light (ultraviolet radiation, visible light), X-rays, electron beam). Radiation-sensitive resin precursors (for example, photosensitive resin precursors) include the negative type, in which portions irradiated with energy have their solubility reduced, becoming insoluble, and the positive type in which portions irradiated with energy have their solubility increased.

The resin layer 20 may be patterned. Patterning refers to the removal of a region of the resin layer 20. For patterning, lithography (for example, photolithography) may be applied. In this case, a mask 30 is used.

Figure 7:
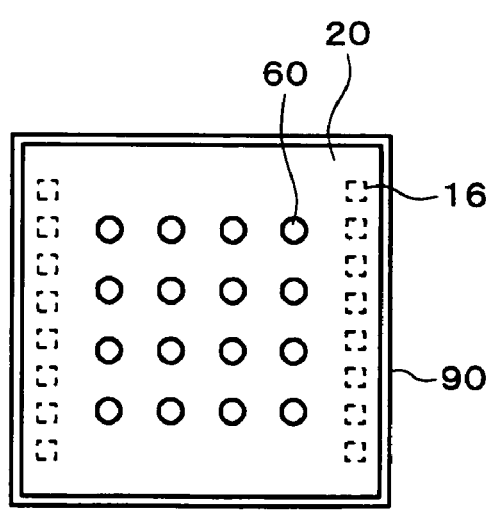
FIG. 7 illustrates a semiconductor device according to an embodiment of the present invention.

The mask 30 may have a transparent-and-opaque portion 32 for removing the portion of the resin layer 20 in the cutting region (for example, a scribing line) when the semiconductor substrate 10 is cut into a plurality of semiconductor chips 90 (see FIG. 7). The transparent-and-opaque portion 32 may be disposed so as to extend over the electrodes 16. The transparent-and-opaque portion 32 may be disposed so as to extend over the region to form the semiconductor chip.

Figure 2:
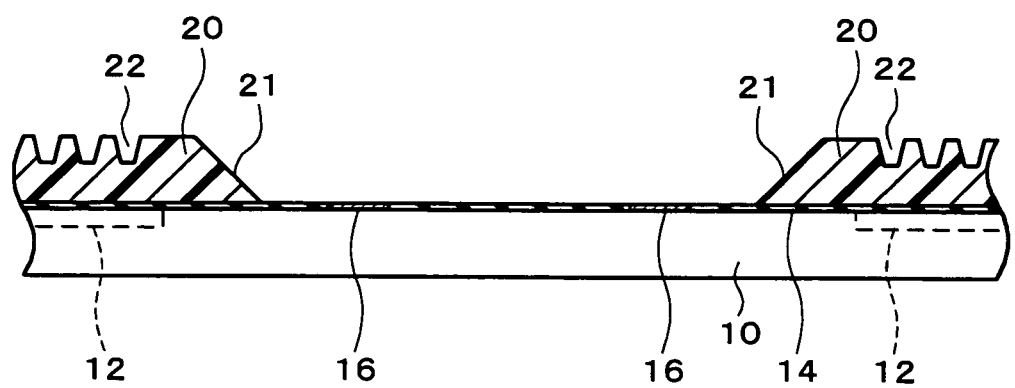
FIG. 2 illustrates the method of manufacturing a semiconductor device according the embodiment of to the present invention.

When the mask 30 is a positive type (that is to say, if the radiation-sensitive resin precursor used to form the resin layer 20 is the positive type), then the transparent-and-opaque portion 32 is a portion transparent to energy (for example, light). If, as shown in FIG. 1 the mask 30 is the negative type (that is to say, if the radiation-sensitive resin precursor used to form the resin layer 20 is the negative type), the transparent-and-opaque portion 32 is a portion opaque to energy (for example, light). In this case, radiation also penetrates in the region directly below the transparent-and-opaque portion 32. As a result, as shown in FIG. 2, the resin layer 20 may have a slanting surface 21 at the extremity formed by the patterning. The patterning of the resin layer 20 may be carried out so that the slanting surface 21 does not extend over the integrated circuit 12, or so that the slanting surface 21 does extend over the integrated circuit 12.

The mask 30 may include in the resin layer 20 a transparent-and-opaque pattern 34 for carrying out energy irradiation (for example, light irradiation) with too fine pattern to be resolved. By a "too fine pattern to be resolved" is meant a pattern so fine that a penetrating space cannot be formed in the resin layer 20. However, even for a fine pattern, through the transparent-and-opaque pattern 34, energy irradiation (for example, light irradiation) is made possible. The transparent-and-opaque pattern 34 is for the purpose of forming recesses 22 in the resin layer 20, and is of a form (including a form of reversed sense) corresponding to the form of the recesses 22 (opening thereof).

If the radiation-sensitive resin precursor used to form the resin layer 20 is a negative type, then the transparent-and-opaque pattern 34 includes an opaque portion 36. Since the radiation is blocked by the opaque portion 36, the region of the resin layer 20 corresponding to the opaque portion 36 is not reduced in solubility. The opaque portion 36 is formed as a too fine form for the resin layer 20 to be resolved. The width of the opaque portion 36 may be not exceeding one-fourths of the thickness of the resin layer 20. The width of the opaque portion 36 may be not exceeding the thickness of the interconnecting lines formed on the resin layer 20, and may be less than this.

As shown in FIG. 2, on the surface of the resin layer 20 is formed a plurality of recesses 22. For the formation of the recesses 22, lithography (for example, photolithography) using the mask 30 may be applied. In more detail, when the resin layer 20 is irradiated with energy through the transparent-and-opaque pattern 34, since the transparent-and-opaque pattern 34 has a too fine form for the resin layer 20 to be resolved, instead of penetrating spaces being formed in the resin layer 20, recesses 22 are formed. The recesses 22 have bottom surfaces. The bottom surface may be flat, and may be parallel to the surface in which opening of the recesses 22 is formed. The recesses 22 may be formed over the integrated circuit 12.

When the resin layer 20 is formed with a negative type radiation-sensitive resin precursor, since radiation also makes its way to the region directly under the opaque portion 36, the recesses 22 may be formed so as to widen from the bottom surface toward the outside. In this case, the inner wall surface of the recesses 22 may be tapered. The formation of the recesses 22 may be carried out at the same time as the patterning of the resin layer 20, or may be carried out separately. The recesses 22 are formed so that their opening width is less than the thickness of interconnecting lines 40 formed on the resin layer 20 (see FIG. 4A). The recesses 22 are formed to have a depth (for example, a depth of at least 1 μm) such as to improve the adhesion properties between the resin layer 20 and the interconnecting lines 40 formed thereon.

Figure 3A:
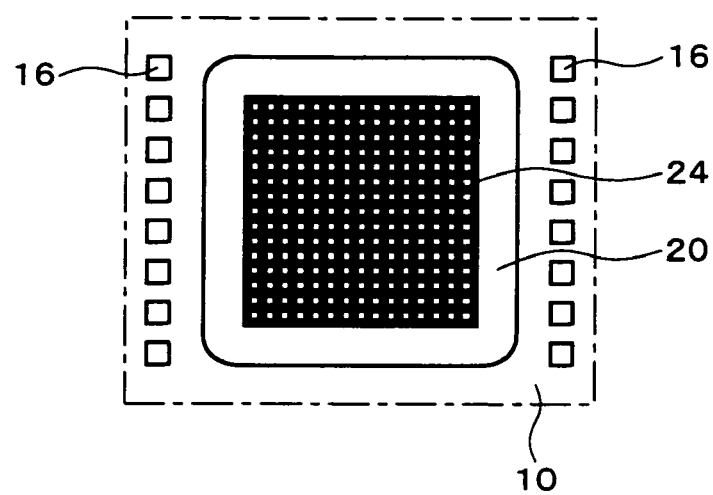
FIGS. 3A to 3C illustrate forms of the opening of a recess.
Figure 3B:
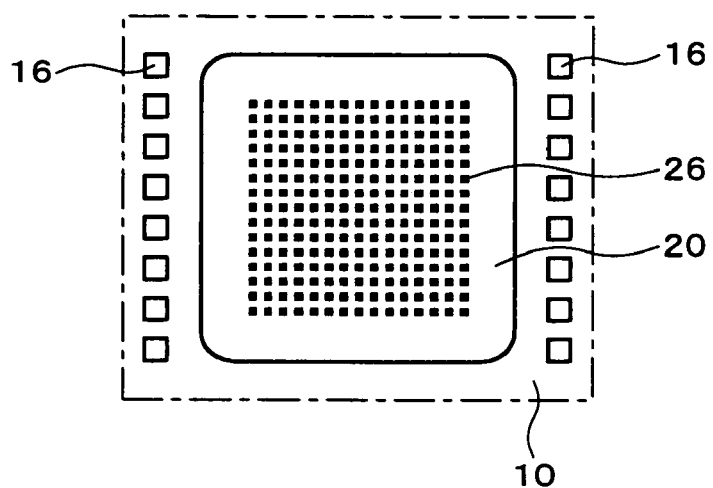
Figure 3C:
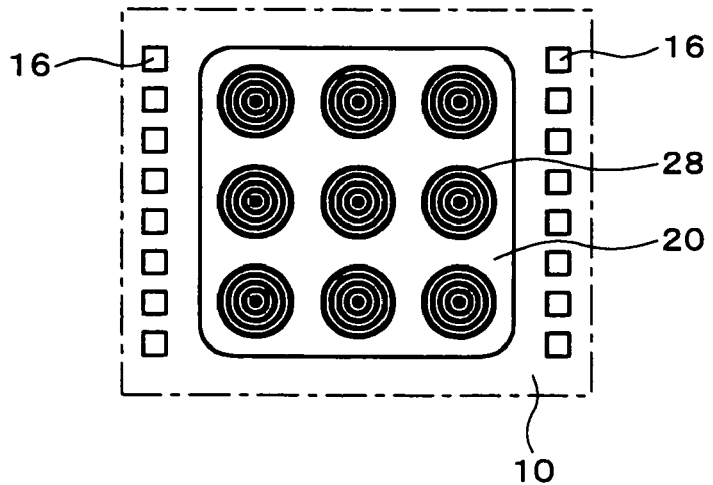

FIGS. 3A to 3C illustrate plan forms of the recess openings, and show the region of the semiconductor substrate 10 to form a single semiconductor chip. The plurality of recesses 24 shown in FIG. 3A forms an interconnected lattice. The plurality of recesses 26 shown in FIG. 3B is disposed in an isolating manner. In this case, the opening form of each recess 26 may be a quadrilateral, or may be a circle. Each recess 28 shown in FIG. 3C is in the form of a ring. In this case, a group of concentric recesses 28 may be formed at the position of formation of a land 42 (see FIG. 5A) of an interconnecting line 40 formed on the resin layer 20. Additionally, a plurality of recesses may form a plurality of grooves. The transparent-and-opaque pattern 34 of the mask 30 has a form corresponding to the form of the opening of a recess (including a form of reversed sense).

In a lithography process (photolithography process), after irradiation with energy (for example, exposure to light), the resin layer 20 is developed. By means of development, the recesses 22 are formed. When the resin layer 20 is formed of a negative type of radiation-sensitive resin precursor, the whole surface of the resin layer 20 in which the recesses 22 are formed may be irradiated with energy (for example, total exposure to light). By means of this, the whole of the resin layer 20 can be cured. The resin layer 20 in which the recesses 22 are formed may also be cured.

The surface of the resin layer 20 including the inner surface of the recesses 22 (for example, the whole surface) may be subjected to a surface roughening process. The surface roughening may be carried out after the above described lithography process (photolithography process), or the reverse may be the case. The surface roughening may be carried out by any of ashing, sputter etching, and sand blasting, or a combination thereof. The recesses and projections created by means of the surface roughening are finer than the recesses and projections formed by the recesses 22. The surface roughening is carried out (only) on the region of the resin layer 20 over the integrated circuit 12. The surface roughening may be carried out on the inner surface of the recesses 22 (for example, the bottom surface only). After patterning, if the extremities of the resin layer 20 have a slanting surface 21, surface roughening may be carried out on this slanting surface 21.

Figure 4A:
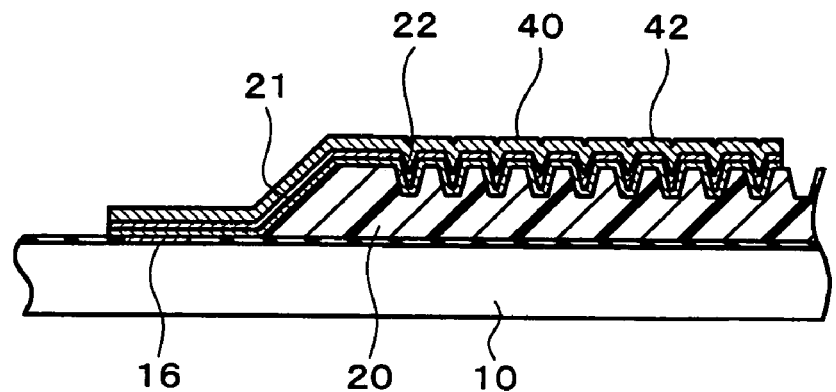
FIGS. 4A to 4C illustrate the method of manufacturing a semiconductor device according the embodiment of to the present invention.

As shown in FIG. 4A, interconnecting lines 40 are formed on the resin layer 20. The interconnecting lines 40 may be formed in one layer, or may be formed in multiple layers. For example, TiW and Cu layers may be deposited by sputtering, and then a Cu layer may be formed thereon by plating. For this formation process, well-known technology can be applied. The interconnecting lines 40 are formed to pass over the electrodes 16 (so as to be electrically connected to the electrodes 16). The interconnecting lines 40 may pass along the slanting surface 21. The interconnecting lines 40 are formed to extend to the region in which the recesses 22 are formed. The interconnecting lines 40 are formed to pass along the recesses 22. In more detail, a part of the interconnecting lines 40 is formed on the inner surface of the recesses 22. The surface of the interconnecting lines 40 may be higher, even within the recesses 22, than the surface of the resin layer 20 (the surface in which the openings are formed). In the surface of the interconnecting lines 40, depressions may be formed over the recesses 22. The interconnecting lines 40 may be formed to have lands (areas wider than the line portions) 42. The lands 42 are for the purpose of providing external terminals 60 (see FIG. 5A) thereon. The lands 42 (only) may be formed over the recesses 22.

Figure 4B:
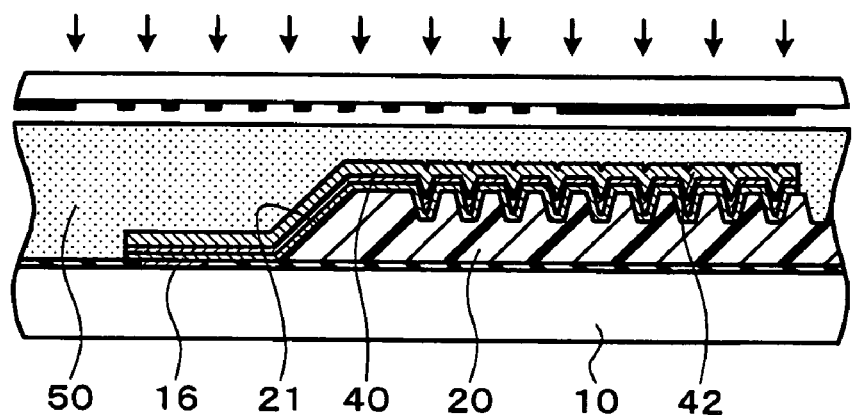

As shown in FIG. 4B, over the resin layer (first resin layer) 20, a second resin layer 50 may be formed. The description of the resin layer 20 may also be applied to the second resin layer 50. The second resin layer 50 may be a solder resist. The second resin layer 50 may be formed to cover the entirety of the interconnecting lines 40 or a part thereof (for example, a part excluding the central portion of the lands 42). The second resin layer 50 may be formed to cover a portion (for example, a scribing line or the vicinity of the electrodes 16) exposed from the resin layer 20 of the semiconductor substrate 10. The second resin layer 50 is formed so as, on the surface exposed from the interconnecting lines 40 of the resin layer 20, to enter the recesses 22.

Figure 4C:
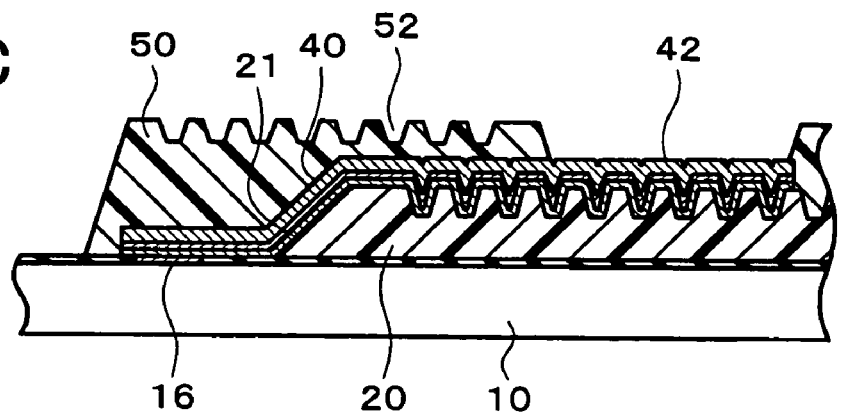

As shown in FIG. 4C, the second resin layer 50 may be patterned. For the form of this, the description of the patterning of the resin layer 20 can be applied. By means of patterning, penetrating spaces are formed in the second resin layer 50. For example, a part of the interconnecting lines 40 (for example, central portions of the lands 42) may be exposed from the second resin layer 50. Alternatively, the cutting region of the semiconductor substrate 10 may be exposed from the second resin layer 50. After patterning, the second resin layer 50 may be left remaining to cover at least a part of the interconnecting lines 40. For example, the second resin layer 50 may cover the electrical connection portion of the interconnecting lines 40 and electrodes 16. The second resin layer 50 may cover the interconnecting lines 40 over the slanting surface 21 of the resin layer 20. The second resin layer 50 may cover all except for the central portions of the lands 42 of the interconnecting lines 40.

This embodiment includes the formation of recesses and projections on the second resin layer 50. In the second resin layer 50, a plurality of recesses 52 may be formed. For the formation thereof, the description of the formation of the recesses 22 in the resin layer 20 can be applied. The recesses 52 may be formed over the resin layer 20, and may be formed over a region of exposure from the resin layer 20 of the semiconductor substrate 10. For details of the recesses 52, the description of the recesses 22 may be applied. To the second resin layer 50, surface roughening may be applied, to form recesses and projections. For this surface roughening, the description of the surface roughening to which the resin layer 20 is subjected may be applied.

Figure 5A:
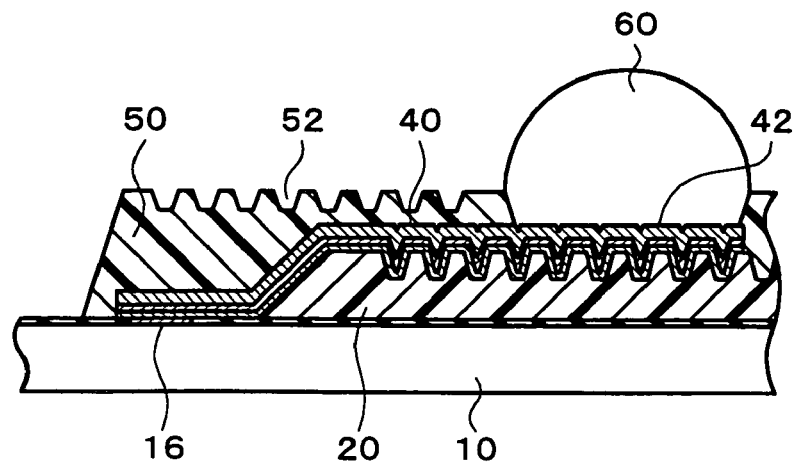
FIGS. 5A to 5C illustrate the method of manufacturing a semiconductor device according the embodiment of to the present invention.

As shown in FIG. 5A, external terminals 60 may be formed. The external terminals 60 may be formed of either of soft solder or hard solder. As soft solder may be used solder not including lead (henceforth referred to as lead-free solder). As lead-free solder may be used a tin-silver (Sn—Ag) type, tin-bismuth (Sn—Bi) type, tin-zinc (Sn—Zn) type, or tin-copper (Sn—Cu) type of alloy, or to any of these alloys may be further added at least one of silver, bismuth, zinc, and copper. For the formation of the external terminals 60, conventional techniques can be applied.

Figure 5B:
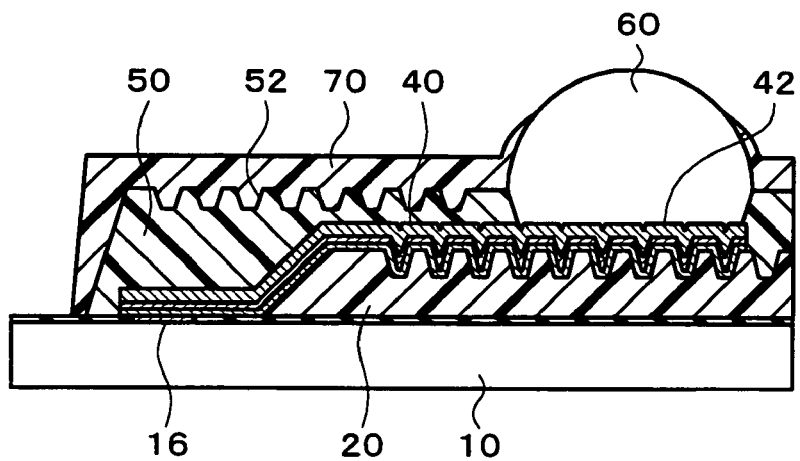

As shown in FIG. 5B, on the second resin layer 50, a third resin layer 70 may be formed. The description of the resin layer 20 may also be applied to the third resin layer 70. The third resin layer 70 may be formed to cover the second resin layer 50. The third resin layer 70 may be formed to enter the recesses 52 in the second resin layer 50. The third resin layer 70 may be formed so that the cutting region of the semiconductor substrate 10 is exposed. The third resin layer 70 may cover the lateral surface of the edge of the cutting region of the second resin layer 50. The third resin layer 70 may cover a part of the external terminals 60 (for example, a root portion). The third resin layer 70 may be formed to cover the entirety of the semiconductor substrate 10, and subsequently patterned. The third resin layer 70 may be provided so that the external terminals 60 are covered, and subsequently the third resin layer 70 removed from the upper extremity of the external terminals 60. For the patterning, the description of the patterning of the resin layer 20 can be applied. Alternatively, using a laser or by ashing, a part of the third resin layer 70 may be removed. The use of a laser or ashing may also be applied to the patterning of the first or second resin layer 20 or 50.

Figure 5C:
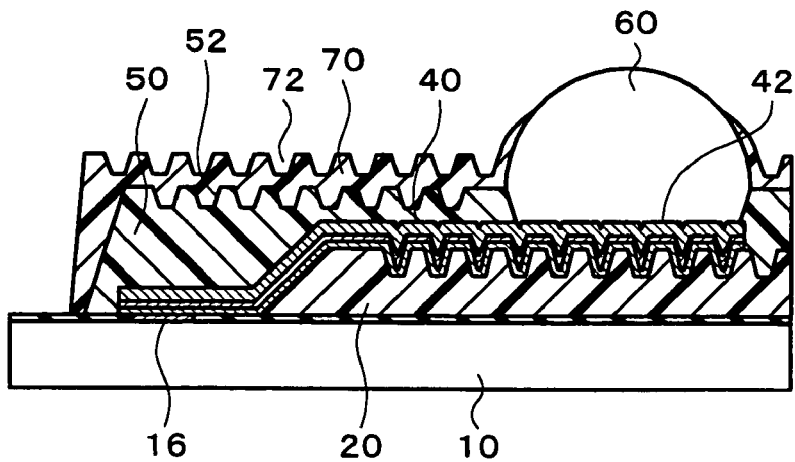

As shown in FIG. 5C, recesses and projections may be formed on the third resin layer 70. For example, a plurality of recesses 72 may be formed in the third resin layer 70. For the formation thereof, the description of the formation of the recesses 22 in the resin layer 20 can be applied. The recesses 72 may be formed over the first and second resin layers 20 and 50. For details of the recesses 72, the description of the recesses 22 may be applied. To the third resin layer 70 surface roughening may be applied, to form recesses and projections. For this surface roughening, the description of the surface roughening to which the resin layer 20 is subjected may be applied. The third resin layer 70 may be formed so as to cover the external terminals 60, then in a step of removing (for example, ashing or the like) the third resin layer 70 from the upper extremity of the external terminals 60, surface roughening of other parts of the surface of the third resin layer 70 may be carried out.

The semiconductor wafer of this embodiment comprises semiconductor substrate 10 made up of a plurality of integrated circuits 12, a resin layer 20 formed on the semiconductor substrate 10 and having a plurality of recesses formed in the surface, and interconnecting lines 40 formed to pass along the recesses 22 in the resin layer 20. More details are as described above.

Figure 6:
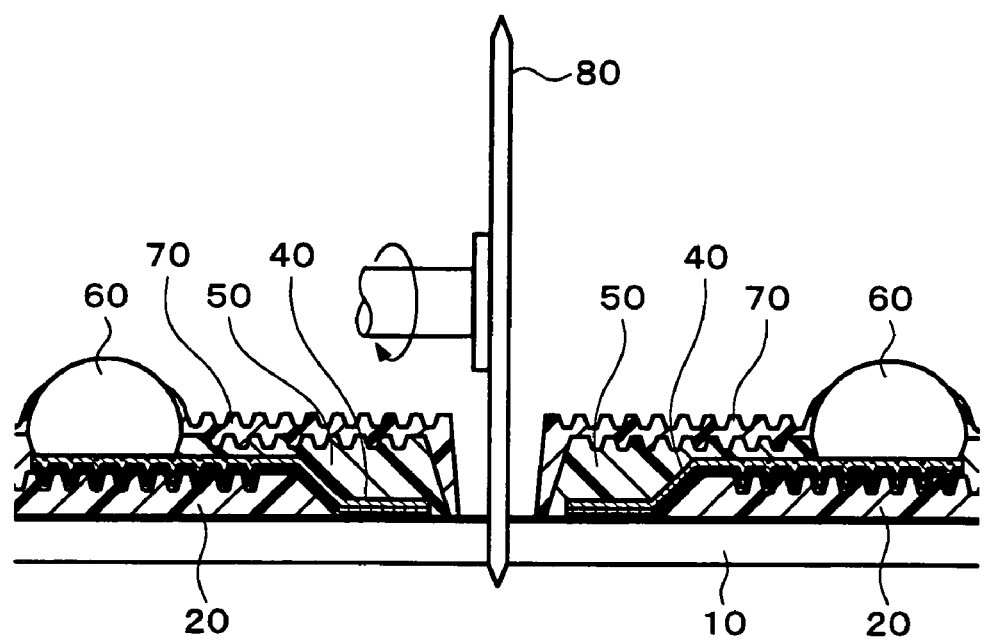
FIG. 6 illustrates the method of manufacturing a semiconductor device according the embodiment of to the present invention.

As shown in FIG. 6, the semiconductor substrate 10 may be cut (for example, by scribing or dicing). If the first, second, and third resin layers 20, 50, and 70 are not provided in the cutting region of the semiconductor substrate 10, since the resin is not cut, clogging of the cutter (or blade) 80 can be prevented.

FIG. 7 illustrates the semiconductor device of this embodiment. The semiconductor device comprises a semiconductor chip 90 having formed an integrated circuit 12, a resin layer 20 formed on the semiconductor chip 90 and having formed in the surface a plurality of recesses 22, and interconnecting lines 40 formed to pass along the recesses 22 over the resin layer 20. The semiconductor chip 90 may be cut from the semiconductor substrate 10. Other details are as described above.

According to this embodiment, since the recesses 22 are formed in the resin layer 20, the adhesion properties of the resin layer 20 and the interconnecting lines 40 (for example, the lands 42 thereof), and the adhesion properties of the resin layer 20 and second resin layer 50 are good. If the surface of the resin layer 20 is subjected to surface roughening, then the adhesion properties are further improved. With regard to the adhesion properties, this applies also to the second and third resin layers 50 and 70. Also, since the recesses 22 are formed in the resin layer 20, light is reflected or refracted, and the opacity of the resin layer 20 is increased. For example, for light with a wavelength in the range 400 to 600 nm, the opacity is increased. If the surface of the resin layer 20 is subjected to surface roughening, the opacity is further increased. With regard to the opacity, this applies also to the second and third resin layers 50 and 70. By virtue of the high opacity of the resin layer 20 and so on, malfunction of the integrated circuit 12 is reduced.

Figure 8:
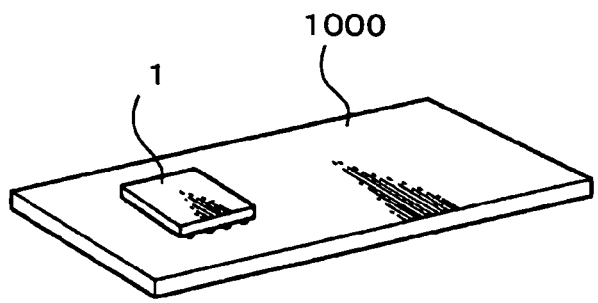
FIG. 8 shows a circuit board having a semiconductor device according to an embodiment of the present invention, mounted thereon.
Figure 9:
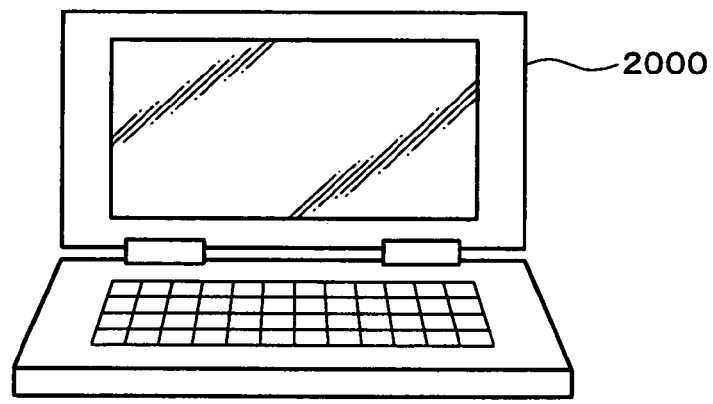
FIG. 9 shows an electronic instrument having a semiconductor device according to an embodiment of the present invention.
Figure 10:
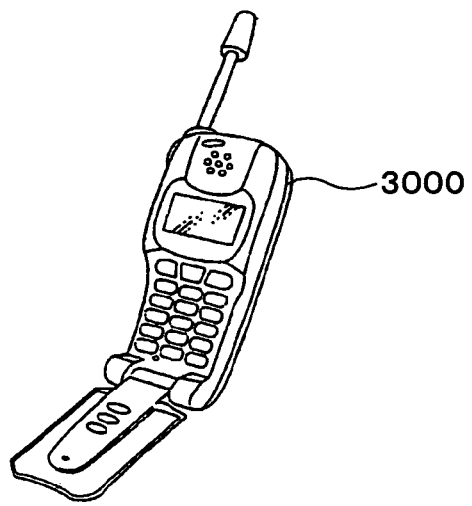
FIG. 10 shows an electronic instrument having a semiconductor device according to an embodiment of the present invention.

FIG. 8 shows a circuit board 1000 on which is mounted the semiconductor device of the above described embodiment. As electronic instruments having this semiconductor device, FIG. 9 shows a notebook personal computer 2000, and FIG. 10 shows a mobile telephone 3000.

The present invention is not restricted to the above described embodiment, and various modifications are possible. For example, the present invention includes substantially the same construction as the construction described in the embodiment (for example, a construction for which the function, method, and result are the same, or a construction of which the purpose and result are the same). The present invention includes a construction in which parts which are not of the essence of the construction described in the embodiment are replaced. The present invention includes a construction having the same effect as the construction described in the embodiment or a construction capable of achieving the same purpose. The present invention includes a construction having the construction described in the embodiment to which is added well-known art.

What is claimed is:

1. A method of manufacturing a semiconductor device comprising:
    forming a resin layer on a semiconductor substrate in which a plurality of integrated circuits are formed;
    making a surface of the resin layer uneven by forming a plurality of recesses therein;
    forming an interconnecting line on the resin layer, the interconnecting line contacting the surface of the resin layer with an interior of the plurality of recesses along which the interconnecting line passes; and
    cutting the semiconductor substrate into a plurality of semiconductor chips;
    wherein each of the plurality of recesses is formed to have an opening width that is less than a thickness of the interconnecting line, and to have a depth of at least 1 µm,
    the resin is formed of a photosensitive resin precursor,
    photolithography using a mask is applied during the step of forming the plurality of recesses,
    the mask includes a transparent-and-opague pattern for irradiating the resin layer with a predetermined pattern that matches the transparent-and-opague pattern,
    the transparent-and-opaque pattern prevents the photosensitive resin precursor from being completely resolved by controlling an amount of energy applied to the resin layer during photolithography, and
    the transparent-and-opaque pattern prevents the recesses from penetrating an entire thickness of the resin layer.

2. The method of manufacturing a semiconductor device as defined in claim 1, wherein the photosensitive resin precursor is a negative type including an insoluble light-sensitive portion, and
    wherein the transparent-and-opaque pattern includes an opaque portion having a width less than or equal to the thickness of the interconnecting line.

3. The method of manufacturing a semiconductor device as defined in claim 2, wherein the width of the opaque portion is less than or equal to one-fourths of a thickness of the resin layer.

4. The method of manufacturing a semiconductor device as defined in claim 1, further comprising:
    roughening the surface of the resin layer including inner surfaces of the recesses, after forming the recesses and before forming the interconnecting line.

5. The method of manufacturing a semiconductor device as defined in claim 4, further comprising:
    forming a second resin layer on the resin layer to cover at least a part of the interconnecting line, after forming the interconnecting line and before cutting the semiconductor substrate.

6. The method of manufacturing a semiconductor device as defined in claim 5, further comprising:
   forming recesses and projections on a surface of the second resin layer.

7. The method of manufacturing a semiconductor device as defined in claim 6, further comprising:
   forming a third resin layer on the second resin layer.

8. The method of manufacturing a semiconductor device as defined in claim 7, further comprising:
   forming recesses and projections on a surface of the third resin layer.

9. The method of manufacturing a semiconductor device as defined in claim 1, wherein the recesses form an interconnected lattice in plan view.

10. The method of manufacturing a semiconductor device as defined in claim 1, wherein the recesses are disposed in an isolated manner in plan view.

11. The method of manufacturing a semiconductor device as defined in claim 1, wherein the recesses include a group of concentric ring-shaped recesses in plan view.

* * * * *